United States Patent [19]

Grassauer et al.

[11] Patent Number: 4,484,704
[45] Date of Patent: * Nov. 27, 1984

[54] SOLDER DELIVERY SYSTEM

[75] Inventors: Willie K. Grassauer, Menlo Park; William M. Robinson, Palo Alto, both of Calif.

[73] Assignee: Raychem Corporation, Menlo Park, Calif.

[*] Notice: The portion of the term of this patent subsequent to Oct. 19, 1999 has been disclaimed.

[21] Appl. No.: 328,762

[22] Filed: Dec. 8, 1981

Related U.S. Application Data

[63] Continuation-in-part of Ser. No. 158,034, Jun. 9, 1980, Pat. No. 4,354,629.

[30] Foreign Application Priority Data

Jun. 8, 1981 [GB] United Kingdom ............... 81117518

[51] Int. Cl.³ ............................................. B23K 3/00
[52] U.S. Cl. ................................ 228/180 A; 228/247; 228/56
[58] Field of Search ......... 228/180 A, 56 R, 245–247, 228/56; 29/830, 840, 843, 860, 879; 339/17 F

[56] References Cited

U.S. PATENT DOCUMENTS

| | | | |
|---|---|---|---|
| 2,390,890 | 12/1945 | MacFarland | 228/246 |
| 3,239,125 | 3/1966 | Sherlock | 228/56 |
| 3,243,211 | 3/1966 | Wetmore | 403/28 |
| 3,297,819 | 3/1966 | Wetmore | 174/127 |
| 3,464,617 | 9/1969 | Raynes et al. | 228/56 |
| 3,538,240 | 11/1970 | Sherlock | 174/88 R |
| 3,589,591 | 6/1971 | Schwenn | 228/44 |
| 3,719,981 | 3/1973 | Steitz | 228/180 R X |
| 3,721,749 | 3/1973 | Clarburn | 174/88 R |
| 3,750,252 | 8/1973 | Landman | 428/571 |
| 3,750,265 | 8/1973 | Cushman | 228/56 |
| 3,914,850 | 10/1975 | Coucoulas | 228/178 |
| 3,926,360 | 12/1975 | Moister, Jr. | 228/180 A |
| 3,996,894 | 8/1968 | Ellis | 228/56 |
| 4,183,611 | 1/1980 | Casciotti et al. | 339/275 B |
| 4,255,853 | 3/1981 | Campillo et al. | 29/843 |
| 4,354,629 | 10/1982 | Grassauer et al. | 228/106 X |

FOREIGN PATENT DOCUMENTS

| | | |
|---|---|---|
| 1552962 | 1/1972 | Fed. Rep. of Germany . |
| 659335 | 10/1951 | United Kingdom ............. 228/56 |
| 688172 | 2/1953 | United Kingdom . |
| 1093176 | 11/1967 | United Kingdom . |
| 1099906 | 1/1968 | United Kingdom . |
| 1099650 | 1/1968 | United Kingdom . |
| 1470049 | 4/1977 | United Kingdom . |
| 2023944 | 1/1980 | United Kingdom . |
| 2027561 | 2/1980 | United Kingdom . |
| 710793 | 1/1980 | U.S.S.R. .................... 228/180 A |

OTHER PUBLICATIONS

Van Nostrand's Scientific Encyclopedia, "Burnishing," p. 254, Van Nostrand Company, Ltd., 1968.

Primary Examiner—Kenneth J. Ramsey
Assistant Examiner—M. Jordan
Attorney, Agent, or Firm—Ira D. Blecker; James W. Peterson; Herbert G. Burkard

[57] ABSTRACT

A solder delivery system has a continuous element of solder material adjacent to at least one polymeric layer, which is provided with window means to control the flow of solder. The layers, if there are more than one, may be separate pieces, or may be parts of a folded sheet or a tube of polymeric material. In use, the conductors to be soldered are placed adjacent to corresponding terminals of a substrate and the system placed in contact with and perpendicular to the conductors, with the window means towards the conductors. On the application of heat and pressure, the solder melts and flows toward the terminals, and solder bridges are prevented by the "window frames" which lie between the terminals.

12 Claims, 33 Drawing Figures

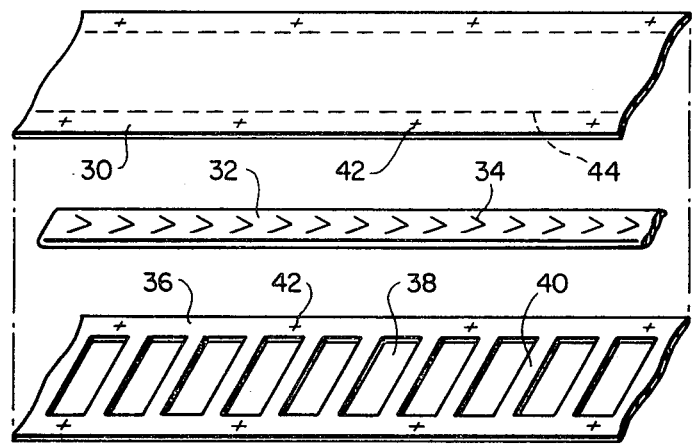
FIG_1
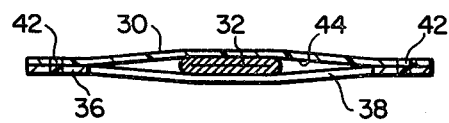
FIG_2
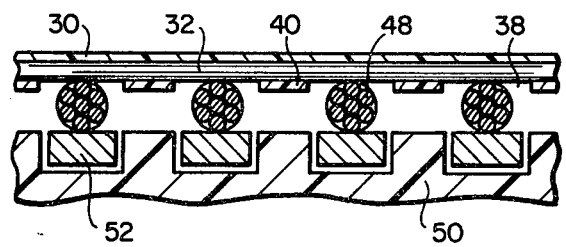
FIG_3
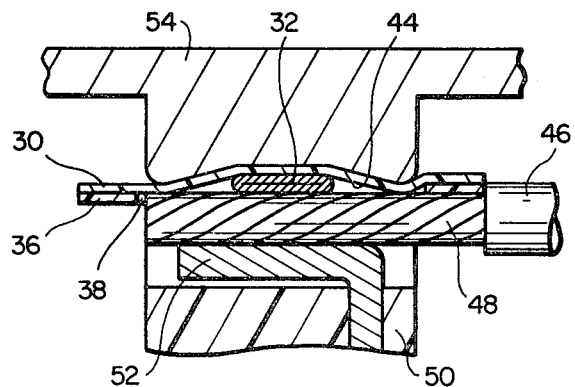
FIG_4

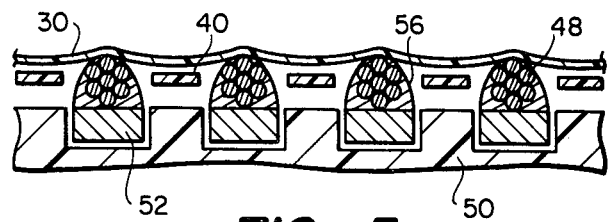
FIG_5
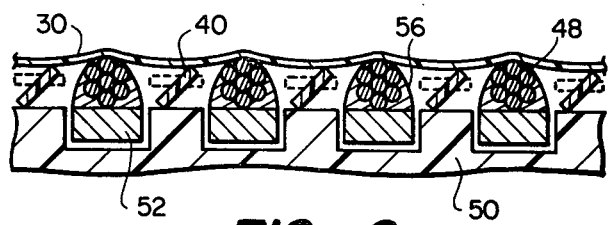
FIG_6
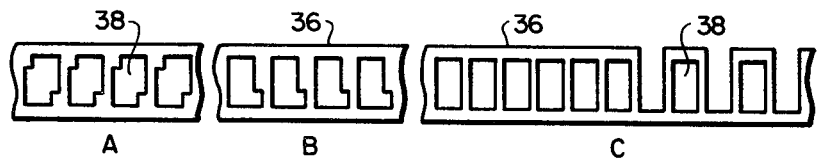
FIG_7
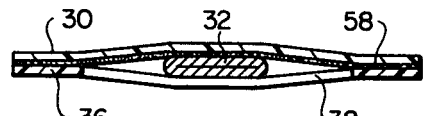
FIG_8
FIG_9
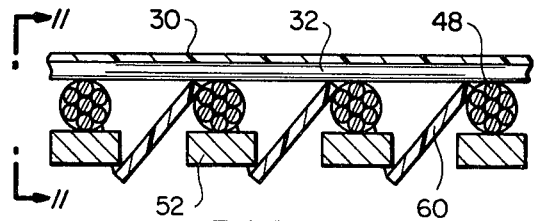
FIG_10

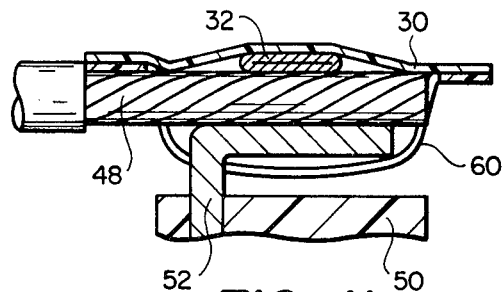
FIG_11
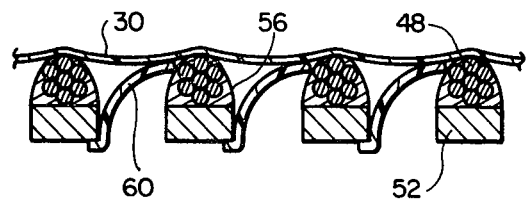
FIG_12
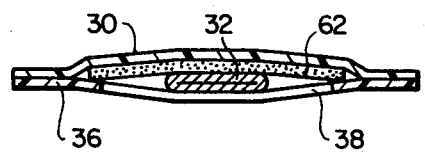
FIG_13
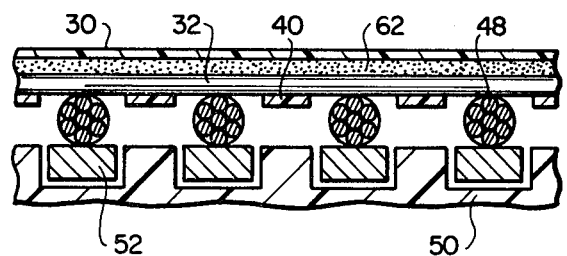
FIG_14
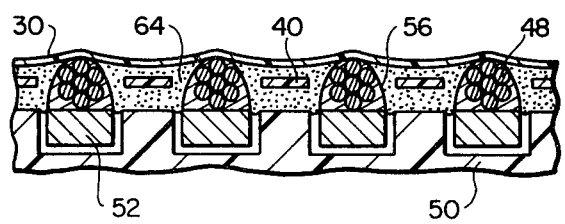
FIG_15

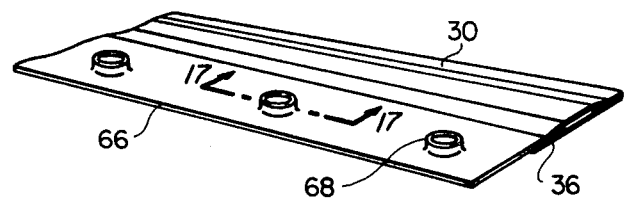
FIG_16
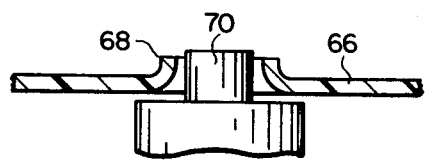
FIG_17
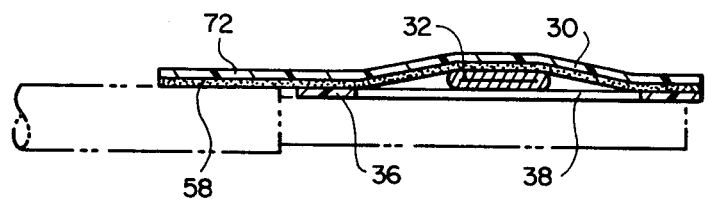
FIG_18
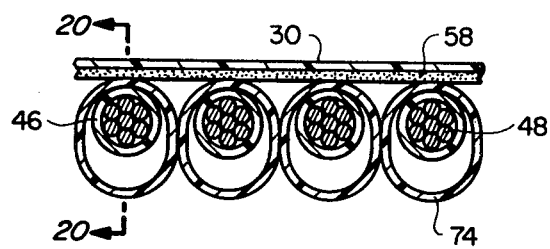
FIG_19
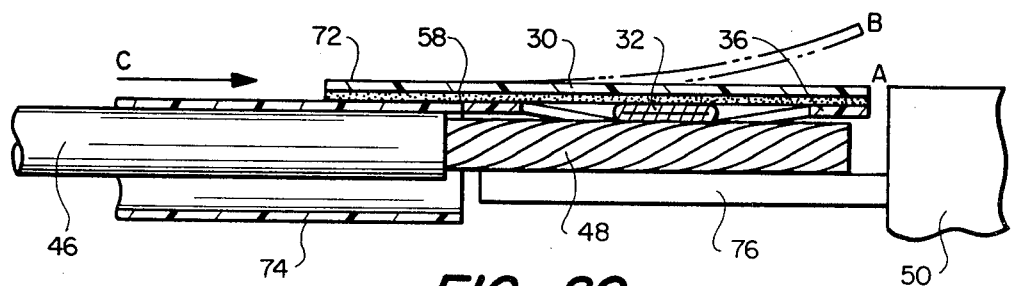
FIG_20

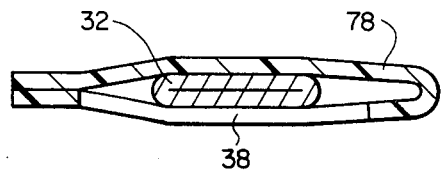
FIG_21
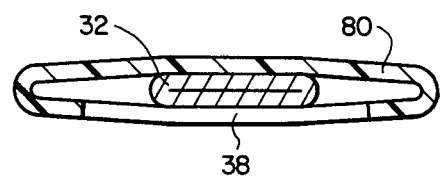
FIG_22
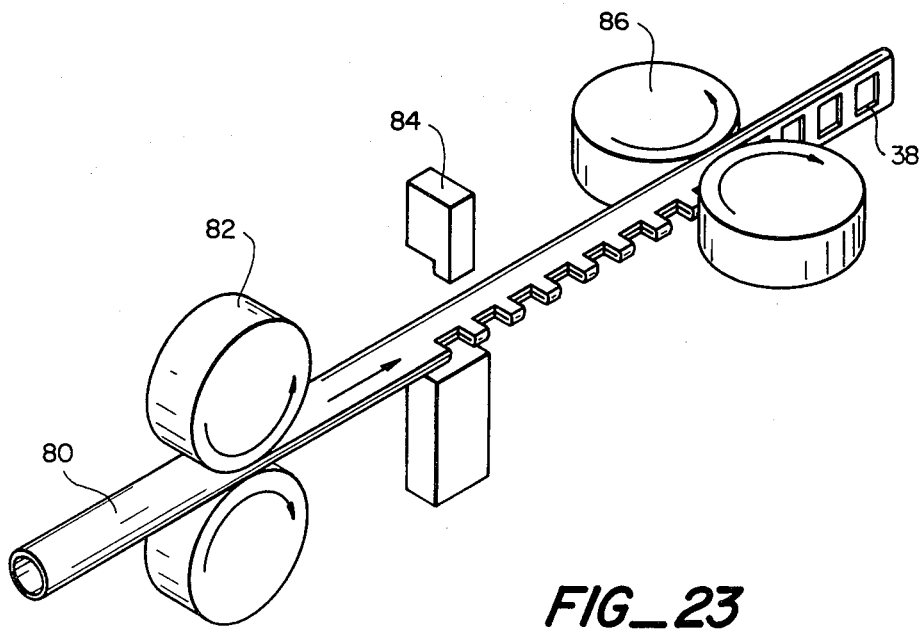
FIG_23

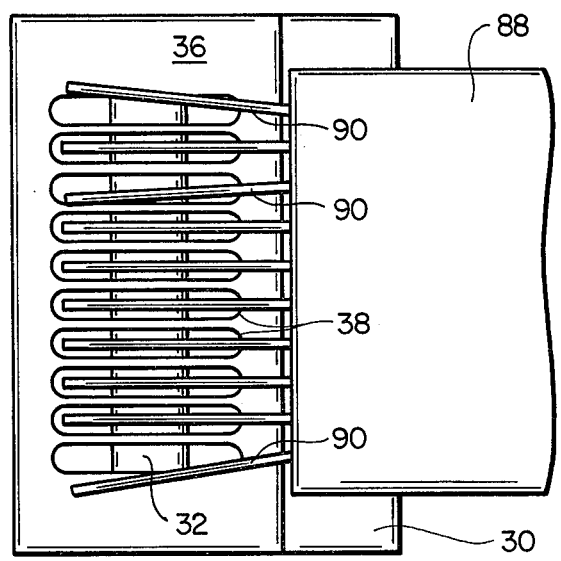
FIG_24
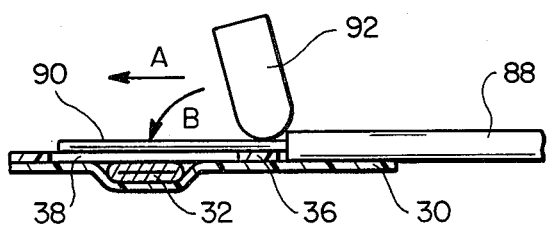
FIG_25
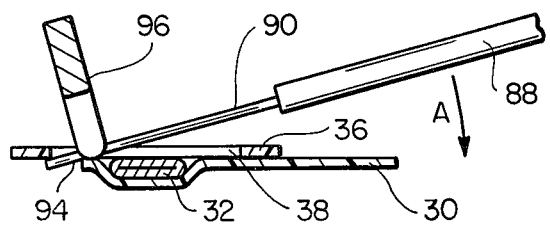
FIG_26

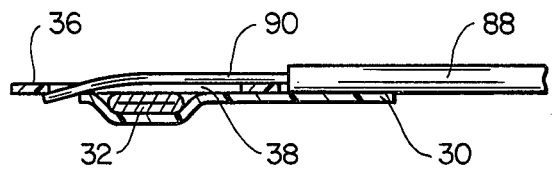
FIG_27
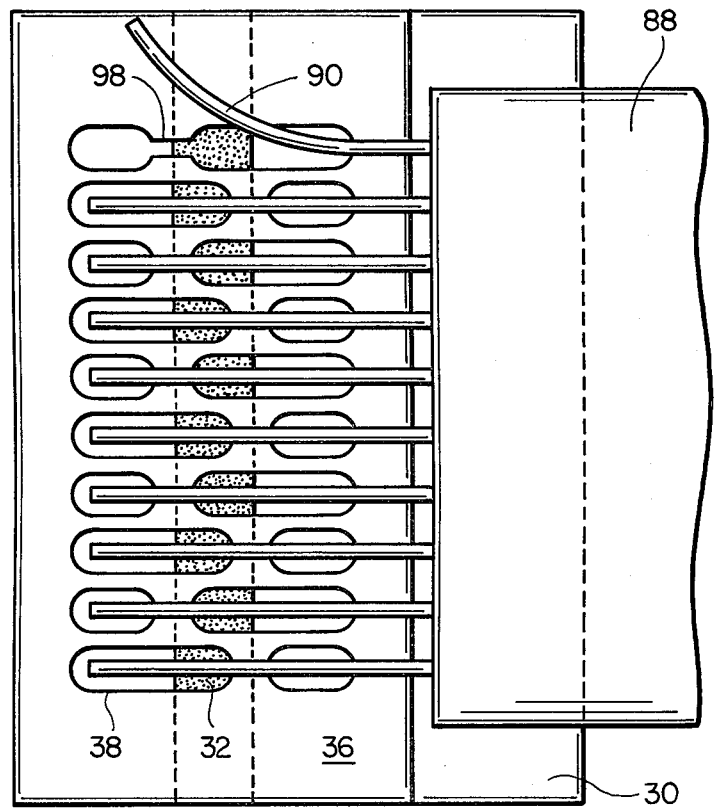
FIG_28
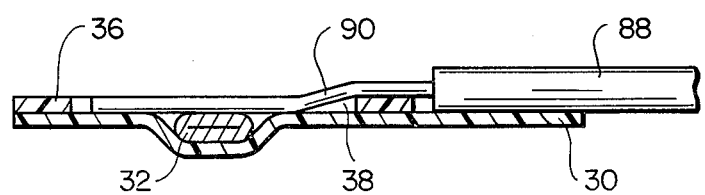
FIG_29

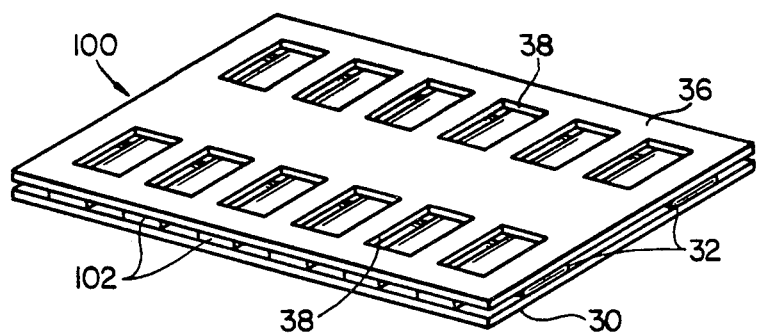
FIG_30
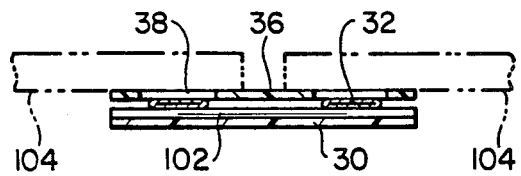
FIG_31A
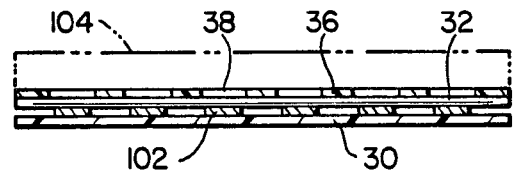
FIG_31B
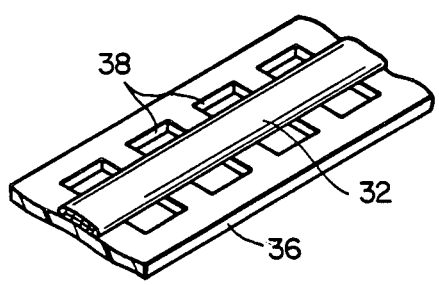
FIG_32A
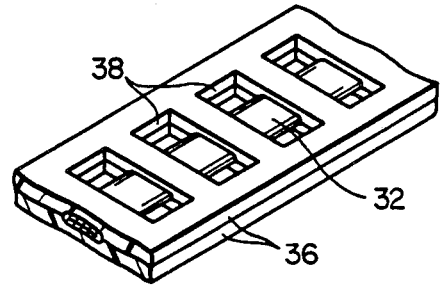
FIG_32B
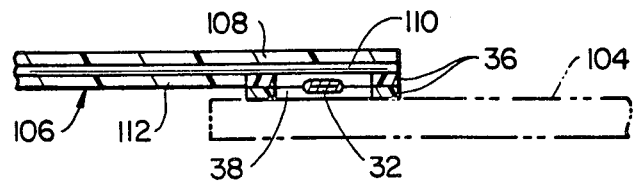
FIG_33

SOLDER DELIVERY SYSTEM

CROSS-REFERENCE TO RELATED APPLICATION

This application is a continuation-in-part of our copending application, Ser. No. 158,034, filed June 9, 1980 now U.S. Pat. No. 4,354,629 issued Oct. 19, 1982 the disclosure of which is incorporated herein by reference.

FIELD OF THE INVENTION

This invention relates to a solder delivery system which employs a continuous solder strip. The system is especially adapted to be used to terminate a plurality of closely-spaced conductors to a connector or similar substrate.

BACKGROUND OF THE INVENTION

Joining flat cable or ribbon cable to connectors can be accomplished by a number of different methods, with soldering being probably the most reliable. However, if all the solder terminations must be done by hand, the costs involved and the time required to perform a multiplicity of repetitive soldering operations far outweigh any gains in reliability. In addition, as connector pin spacing decreases, due to higher interconnection densities, the reliability of hand soldering decreases because of the possibility of solder bridging terminations and shorting out adjacent connectors. It would therefore be desirable to have a solder system in which all leads can be soldered to the connector simultaneously, rapidly and reliably for a wide range of a number of terminations and spacings.

In the past, various systems have been developed for simultaneously applying a plurality of bodies of solder. One such system is that disclosed in U.S. Pat. No. 3,396,894, which discloses the prepackaging of metered amounts of flux and solder in a heat-recoverable preformed polymer sheet which forces the solder into place. The patent teaches the use of discrete pieces of solder which must be precisely positioned above regions to be soldered. As heat is applied, the polymer sheet returns to its original flat configuration prior to solder melting.

U.S. Pat. No. 3,719,981 discloses an alternative method of applying solder balls, which are appropriately spaced on the tacky surface of a pressure-sensitive tape, to solder bumps used for connections.

Both of the above methods rely on the positioning of the small pieces of solder immediately adjacent to the terminals which are to be soldered, and, because small pieces of solder are used, each of the solder systems disclosed is difficult to manufacture.

U.S. Pat. No. 3,750,252 discloses the use of a single continuous piece of solder to simultaneously solder a large number of terminals. The solder wire extends along a terminal strip and, on heating, the solder melts and coalesces on the individual contacts to form independent connections.

U.S. patent application Ser. No. 133,038, filed Mar. 24, 1980 now abandoned and assigned to the assignee of the present invention, also describes the use of a continuous solder strip. In this application, the disclosure of which is incorporated herein by reference, the solder strip is embedded within a heat-recoverable polymeric strip which, together with interfacial forces (capillary action), acts to direct the solder towards individual contacts when it melts.

With the increasing use of ribbon or "flexprint" cable, especially multilayer cable, which is analogous to flexible printed circuit board, and the decreasing size of many electronic assemblies, so that bulky connectors are disadvantageous, a method of terminating flat cables to flat substrates has also become extremely desirable.

SUMMARY OF THE INVENTION

The present invention provides a solder delivery system which comprises a continuous strip of solder in operative contact with at least one layer of polymeric material which has window means to direct the flow of flux and solder when heat is applied to melt the solder, and to permit electrical interconnection through the layer. The solder strip is positioned adjacent to the window means, by which is meant the solder will flow through the window means in use, and the solder is preferably positioned directly above the window means.

BRIEF DESCRIPTION OF THE DRAWING

FIG. 1 is an exploded view of a first embodiment of the solder delivery system of this invention, while FIG. 2 depicts this embodiment in cross-section.

FIGS. 3 through 5 depict the use of this first embodiment for termination of a plurality of conductors.

FIG. 6 depicts the use of a second embodiment of this invention.

FIG. 7 shows three alternate shapes for the window means of the lower layer of polymeric material.

FIG. 8 depicts a third embodiment employing an adhesive.

FIG. 9 depicts a fourth embodiment, and FIGS. 10 through 12 the use of that embodiment.

FIG. 13 shows a fifth embodiment containing a sealant, and FIGS. 14 and 15 show its use.

FIG. 16 shows a sixth embodiment wherein one or more of the polymeric layers have been extended and heat-recoverable features created, while FIG. 17 shows a use for such heat-recoverable features.

FIG. 18 depicts a seventh embodiment wherein the upper polymeric strip has been extended.

FIG. 19 depicts an eighth embodiment employing sections of heat-shrinkable tubing, while FIG. 20 shows the use of this eighth embodiment.

FIG. 21 depicts a ninth embodiment in which the two layers of polymeric material are part of a folded polymeric sheet.

FIG. 22 depicts a tenth embodiment in which the two layers of polymeric material are part of a polymeric tube, while FIG. 23 shows a method of manufacture of the window means.

FIG. 24 depicts a situation in which some of the conductors of a cable are misaligned, while FIG. 25 depicts the use of a burnisher to align them.

FIG. 26 depicts an eleventh embodiment in which the backing layer has holes through which the conductors may protrude, and FIG. 27 depicts that embodiment with a cable ready for soldering.

FIG. 28 depicts the use of windows shaped to retain the conductors of a cable, while FIG. 29 is a side view of FIG. 28.

FIG. 30 depicts in perspective a connector for joining, e.g., printed circuit boards, while FIG. 31 depicts the connector in place for soldering.

FIG. 32 depicts a further embodiment in which the imperforate backing strip is absent, and FIG. 33 depicts the use of that embodiment to terminate a ribbon cable to a substrate.

DESCRIPTION OF THE PREFERRED EMBODIMENTS

As used herein, solder means any metal or metallic alloy used to join metallic surfaces by melting that metal or metallic alloy and then allowing it to cool. A solder strip, as used herein, means an elongated, continuous element of solder of any cross-section including, but not limited to, round, square, flat, or any other cross-section. Such a solder strip may contain a flux core and/or may be coated on all or a part of its outer surface with a flux coating. The strip may be perforated to enable better flow of a flux core.

FIG. 1 depicts, in exploded view, a first embodiment of the solder delivery system of this invention. The system comprises an upper polymeric layer 30, a solder strip 32, which may have perforations 34 to enable better flux flow, and a lower polymeric layer 36, having window means 38, said solder strip 32 being positioned over said window means 38 through which the solder will flow on melting. Window means 38 also comprise a plurality of window frames 40. In this first embodiment, the upper and lower polymeric layers are attached together in laminate form by heat-welding at a plurality of points 42. Of course, this heat-welding may be performed along the entire edges of the polymeric layers, and not just at a series of points, if so desired. A fluxing agent 44 may be coated onto the underside of the upper polymeric layer 30 by any suitable means, either before assembly of the solder delivery system or after it has been assembled.

FIG. 2 is a cross-sectional view of the first embodiment of the solder delivery system, in its assembled form. The solder strip is seen to be sandwiched between the upper and lower polymeric layers.

The polymeric layers should preferably be made of materials capable of resisting elevated temperatures for the time needed to melt and flow the solder, generally about 15 seconds. Suitable materials include, for example and not by way of limitation, polyvinylidene fluoride, poly(parabanic acid), and poly(pyromelittimide) or other high-temperature polyamides or -imides. These polymers may be cross-linked by either chemicals or radiation to improve their high-temperature properties. While the provision of adhesive and sealant layers is contemplated by this invention, and will be discussed in more detail below with respect to certain preferred areas, it is also contemplated that the polymeric layers may themselves have adhesive properties, even though they are generally required to be non-melting in use. Such properties may be particularly desirable for the window layer, and may be provided, for example, by extensive cross-linking of an adhesive material. By this means, the device may be adhered to a substrate in use.

Lower-temperature polymers, such as polyethylene, etc., may be used depending on the particular use to which the delivery system is to be put, and the choice of suitable materials is considered to be within the scope of one skilled in the art in view of this disclosure.

In embodiments in which the polymeric layers are not of unitary construction, a typical thickness for the upper polymeric layer may be about 0.004 inches, while a typical thickness for the lower polymeric layer may be somewhat greater, for example, about 0.007 inches. It is of course possible that these layers may be thicker, especially if a high degree of dimensional stability or rigidity is desired, or they may be thinner provided that they retain their heat-resistant characteristics. Of course, when the polymeric layers comprise a single folded sheet or a tube, the thickness of the upper and lower layers will be the same, and may typically be from about 0.004 to about 0.007 inches. Depending on the application, the solder strip may be about 0.006 inches thick.

The width of the polymeric layers will, of course, depend on the application to some extent, but may be, for example, about 0.2 inches with the width of the window means being approximately the length of the connector tab.

FIGS. 3 through 5 depict the use of the solder delivery system to terminate a plurality of conductors to, for example, a connector body. In FIG. 3, the system is seen in cross-section emplaced above a plurality of conductors 48, each of which lies over a connector tab 52 emerging from a connector body 50. While the conductors 48 have been shown aligned on the center of the tabs 52, it is an advantage of this system that considerable misalignment of the conductors with their corresponding tabs will not adversely affect the quality of the soldered joints produced.

FIG. 4 depicts the assembly of FIG. 3 in cross-section parallel to the conductors. Wire 46 has conductor 48 which lies above the connector tab 52. A heating tool platen 54 is shown positioned above the assembly. This platen may be heated, for example, electrically or by focused, high-intensity infrared radiation applied to its upper surface. On the application of heat and pressure the upper polymeric layer 30 rapidly softens to allow close contact between the platen 54 and the solder 32 and conductor 48. Heat rapidly transfers to the connector tab 52, as all the items have low thermal mass. The flux present, either in flux coating 44 or associated with the solder strip 32, is directed onto the conductor and connector tab and cleans them so that the solder will form a sound joint. During the time the solder is molten, the polymeric window frames 40 will resist wetting by the molten solder and may swell due to the heating, thus effectively preventing the formation of solder bridges.

The polymeric materials used in the construction of this invention are important in the transfer of thermal energy. While the primary heat transfer occurs through the metallic elements, including the conductors, terminals, and solder, a significant amount of heat is transferred through the window in a parallel manner. Additionally, the flux trapped within the window spaces is a significant source of circulatory liquid and vapor mass heat transfer. The presence of these additional heat transfer paths contributes to the overall speed and quality of the desired solder connections.

The heating tool platen 54 remains in contact with the assembly throughout the heating-cooling cycle. This maintains conductor-tab contact until the solder joints are formed. The precise shape of the platen may be chosen to optimize heat flow to the metal parts, while minimizing heat damage to the plastic connector body or cable insulation. While the platen will generally be of unitary construction and rigid, it is also envisaged that the platen may comprise an elastomeric portion or may be of spring-loaded "piano-key" construction (with the "keys" being made, for example, from 0.025 or 0.050 inch wide leaf springs (reeds)). Such a conformable platen would accomodate connector tabs and/or conductors of different heights and thicknesses and ensure the application of adequate pressure and heat to the joints.

FIG. 5 shows the completed termination, where flowed solder 56 joins the conductors 48 to the connector tabs 52. The window frames 40 help prevent the formation of solder bridges between adjacent conductors or tabs.

FIG. 6 depicts a completed termination when a second embodiment of the system has been used. In this second embodiment, the lower polymeric layer has been rendered heat-recoverable in such a way that, on heating, the window frames 40 rotate, as shown by the arrows, from their original positions (shown in phantom) so as to more effectively block the flow of solder between adjacent conductors.

FIG. 7 shows some possible alternative shapes of the window means for different connector designs. In A, inset corners are used to align the solder strip in the center of the window; in B, at the bottom edge. The window means may also be shaped to aid in directing the solder flow. In C, portions of the lower polymeric layer have been cut away to accomodate connector features. The window means may also be shaped to assist in locating the conductors to be terminated, as will be discussed below.

FIG. 8 depicts a third embodiment of the solder delivery system. In this embodiment, the upper and lower polymeric layers are not heat-welded together, but rather are joined by an adhesive 58. This adhesive also serves to locate the solder strip 32. The adhesive may be a pressure-sensitive adhesive, for example, one coated on the upper polymeric layer 30 before assembly, or may be a curable adhesive such as one cured by ultraviolet light or radiation. An advantage of curable adhesive is that it may be rendered non-flowing at soldering temperatures. If a radiation-curable adhesive is employed, cross-linking of the polymeric layers (if desired) and curing of the adhesive may be performed simultaneously.

In FIG. 9, the lower polymeric layer 36 of a fourth embodiment is shown. In this embodiment, windows have not been cut out from the layer but window means comprising louvers 60 have been formed in it. As with the layer of the second embodiment, this layer 36 has been rendered heat-recoverable.

FIG. 10 depicts this fourth embodiment of the system in use. The louvers 60 completely separate the conductor-tab pairs from each other.

A cross-sectional view in the direction indicated by the arrows A of FIG. 10 is shown in FIG. 11, illustrating the manner in which the louvers 60 act.

FIG. 12 depicts the assembly of FIG. 10 after heating. The flowed solder 56 has joined the conductors 48 to tabs 52, while the louvers 60 have recovered to pull the upper layer 30 towards the joint. Such an arrangement is especially suitable when it is intended that the polymeric layers remain in place on the joints instead of being removed.

FIG. 13 shows in cross-section a fifth embodiment of the solder delivery system which additionally comprises a sealant 62. Such a sealant may be, for example, a thermoplastic, hot-melt, mastic, or other suitable material.

In FIG. 14, the system of FIG. 13 is shown emplaced above a set of conductors 48 and a connector having tabs 52.

In FIG. 15, the assembly of FIG. 14 is shown after heating. The flowed solder 56 forms joints between the conductors 48 and tabs 52 while the flowed sealant 64 encapsulates these joints. The use of a sealant stabilizes the joints, lengthens the electrical leakage paths, and helps to immobilize conductive or ionic materials. This use is particularly appropriate when it is intended that the upper polymeric layer 30 should remain in place above the conductors 48.

In FIG. 16, a sixth embodiment of the solder delivery system of this invention is shown. One or both of the polymeric layers have been extended to form an extension 66, into which may be introduced additional features such as alignment holes. FIG. 16 depicts the formation of heat-recoverable features 68 shown, for example, as a fastening socket in this extension 66.

FIG. 17 shows a mode of use of the heat-recoverable features 68 shown in FIG. 16. When the features 68 are placed over a boss 70, for example, a locating boss on the body of the connector on which the system is to be employed, and heated, such as when the solder joints are made, the features recover to the position shown in phantom to lock the polymeric layers onto the boss. Especially if the boss is mushroom-shaped, the system will be fastened to the boss in such a way that removal will require substantial force.

In FIG. 18, a seventh embodiment is shown, wherein the upper polymeric layer 30 has been extended to form an extension 72 which is coated with adhesive 58. Use of this embodiment enables the strip to be fastened to, for example, the cable as shown in phantom, which is to be terminated to a connector. Although only one side of the layer 30 has been shown extended, it is of course possible for both sides to be extended to adhere to both the cable and a connector. In this way, the soldered joints may be completely encapsulated.

FIG. 19 depicts an eighth embodiment of the solder delivery system in which a plurality of heat-shrinkable tubes 74 have been attached by adhesive to the extension 72 of the upper polymeric layer 30. This embodiment is particularly suitable for termination of individual conductors and/or terminations to protruding tabs.

FIG. 20 shows the mode of use of this embodiment. Tabs 76 protrude from connector body 50. Each of a plurality of wires 46 is placed through a heat-shrinkable tube 74 so that the conductor 48 lies over a tab 76. Then, with the body of the solder delivery system in position A, the assembly is heated in only the region of the tabs so as to solder the conductors to the tabs. When the soldering operation is complete, the upper polymeric layer is pulled up to position B (shown in phantom) and the tubes 74 slid forward in the direction of arrow C by pulling on the layer 30. When the tubes 74 each completely cover the soldered tab-conductor pairs, the polymeric layer 30 may be peeled completely free and the tubes 74 shrunk, by e.g., a hot-air gun or infrared lamp, to completely insulate the joints.

In FIG. 21, a ninth embodiment is shown, in which the upper and lower polymeric layers are part of a single polymeric sheet 78 which is folded about the solder strip 32 after the window means 38 have been formed in the sheet 78. The upper and lower layers 30 and 36 may be joined on the side opposite the fold by any suitable method, such as heat-welding or the use of an adhesive. While FIG. 21 depicts only the simplest form of this embodiment and corresponds generally to FIGS. 2 and 8 in that regard, it is of course possible for other features such as, for example, the heat-recoverable window frames of FIGS. 6 or 9, the sealant of FIG. 13, or the extensions of FIGS. 16–20 to be incorporated together with the folded sheet feature of this embodiment.

FIG. 22 illustrates a tenth embodiment in which the upper and lower polymeric layers are part of a polymeric tube 80. Window means 38 have been formed in this tube 80 and the tube flattened in such a way that the solder strip 32, which has been inserted in the tube, lies above the window means 38. A sealant or adhesive may also be placed within the tube, though this is not depicted in the Figure.

FIG. 23 illustrates a method of forming the window means in the tube 80 of FIG. 22. The tube is flattened by a set of vertical rolls 82 and a punch or cutter 84 used to cut one edge of the flattened tube. If the tube is then re-flattened by a set of horizontal rolls 86 at 90° to the first set, window means 38 are formed in the tube. Depending on the polymer properties, a simple re-flattening of the tube may be sufficient to form the window means, or it may be desirable to hold the tube flat by the use of an internal adhesive or by heat-welding portions of the tube together.

For making connections to the edges of substrates, a configuration like the edge-cut but not re-flattened tube of FIG. 23 may be useful. This type of solder delivery system may be particularly easily produced from a tube or folded sheet, but may also be produced from separate polymeric layers if desired.

Attention should also be directed to the usefulness of the windows of this invention for wire guidance. Many cables to be soldered by use of the invention have extremely fragile, easily bent wires. Since there are usually several tens of these wires in a cable, only one bent or misaligned wire can effectively compromise the quality of all the rest. The windows of the invention may serve to straighten and align the conductors of a cable.

FIG. 24 shows a cable 88 with stripped conductors 90 emplaced on the solder delivery system of this invention. The backing layer 30, like that of FIG. 18, may adhere to the cable, and the system is placed initially so that the windows 38 are aligned with the conductors as they emerge from the cable insulation.

As shown in FIG. 25, a burnisher 92 or similar tool is stroked along the conductors in the direction of arrow A, away from the cable insulation, to align the misaligned conductors. Downward pressure is also applied to cause the wires to move in the direction of arrow B and enter the windows 38, thus aligning them. Pressure may then be applied to the assembly to cause good adhesion of the aligned components, and alignment should thus be retained until soldering, thus preventing deformation of individual wires within the cable during handling, etc.

FIG. 26 depicts an eleventh embodiment of this invention which also facilitates conductor alignment. If the backing layer 30 is placed so as to expose window 38 to the back via a small aperture 94 (or if the backing layer has suitable perforations), a hole for each wire is created. The misaligned wires may be straightened with a comb-like device 96 and the tips of the conductors 90 threaded through the apertures 94. The comb may then be removed and the cable 88 bent in the direction of arrow A to afford the situation of FIG. 27. If desired, before soldering occurs the cable may be pulled back (once the assembly is emplaced against the termination substrate) to leave no protruding conductor ends.

An additional feature of the window means of the invention is that they may keep conductors aligned during actual soldering. In particular, when soldering a multiplicity of small diameter wires to a printed wiring board, the wires may tend to fall off during application of heat and force. The windows may be further configured to minimize this tendency.

Maintenance of conductor alignment is shown in FIGS. 28 and 29 by one of many possible window shape variations. The windows 38 in window layer 36 have localized areas of restricted width ("grips") 98 on the precise locations desired. The window layer portions adjacent to each end of the windows provide structural rigidity and location accuracy for every conductor. In the case shown, the grip width is an interference fit to the diameter of the conductors 90, and partly overlays the solder strip 32, shown shaded. In such a case, the grips are preferably staggered so that the potential growth incurred when the conductors are forced into place may be absorbed by simple bending of the window frames. The balance of the window remains wide enough to permit formation of a good solder fillet along the remaining conductor length, and the solder is placed to correctly guide the flow into each window. FIG. 29 illustrates this in side view.

It may be recognized also that flat conductors may be readily soldered to terminals and to flat substrates (such as printed circuit boards) by means of this invention. FIG. 30 depicts a connector for joining, especially, flat substrates. The connector shown generally at 100 comprises, in effect, two of the solder delivery systems shown earlier in a unitary construction, which further comprises flexible conductors linking them. In this connector, the backing layer 30 is conventional for the invention, while the window layer 36 has two sets of windows 38. Solder strips 32 underly each set of windows. Between the solder and the backing layer, and linking pairs of windows, are electrical conductors 102 shown in phantom. These conductors may be of any type, but preferably will be foil such as is found in "flexprint" cable.

FIG. 31A illustrates the use of the connector to join two flat substrates 104 (the view is a side view immediately prior to soldering), while FIG. 31B is a cross-section through one of the rows of windows.

The distance between the rows of windows, i.e. the length of the connector, may of course be much greater than is shown in the Figures, so that the connector becomes, in effect, a self-soldering flexible cable.

When it is not desired to make a special cable/connector of the type shown in FIGS. 30 and 31, an embodiment of this invention such as is shown in FIG. 32 may be employed with existing cable. Here, in FIG. 32A, there is no backing layer present, just a solder strip 32 and window layer 36. In FIG. 32B, the solder strip 32 is sandwiched between two window layers 36.

A typical use for this embodiment is shown in FIG. 33. Here a cable shown generally at 106 comprises two layers of insulation 108 and 112 protecting conductors 110. The insulation 112 has been stripped back on one side only, and the solder delivery system of FIG. 32B applied to the stripped area so that the windows 38 align with the conductors 110. Such an assembly may easily be soldered to a flat substrate 104 shown in phantom. While this embodiment is expected to be of special value for "flexprint" cable, it may be used for other flat cable also.

In the embodiments of FIGS. 30–33, it may be particularly advantageous for the window layer to either have adhesive properties, or be coated with an adhesive such that any soldered connection is also strain-relieved.

Although the foregoing discussion, and the Figures, have shown the window means aligned in a single row, it is within the scope of the invention for them to be staggered in, for example, a saw tooth or stair-step configuration. Such a staggered configuration may aid in improving the reliability of the terminations thus formed and allowing a greater density of terminations.

From the foregoing detailed description of several embodiments of this invention, it is evident that there may be a number of changes, adaptations, and modifications which come within the province of those skilled in the art. However, it is intended that all such variations not departing from the spirit of the invention should be considered within the scope thereof as limited solely by the appended claims.

We claim:

1. A solder delivery system comprising:
   (a) at least one layer of polymeric material having window means therethrough; and
   (b) a solder strip with flux disposed in operative contact with said at least one layer and adjacent said window means;
   said window means directing the flow of solder and flux from said solder strip through said window means when said delivery system is heated.

2. A solder delivery system as in claim 1 which comprises a single layer of polymeric material.

3. A solder delivery system as in claim 1 wherein said window means are further adapted to grip conductors placed in operative contact therewith.

4. A method of aligning the stripped conductors of a cable to be soldered using the solder delivery system of claim 3 which comprises:
   (a) aligning said cable with said system; and
   (b) burnishing said conductors into the window means of said system so that the conductors are gripped by said window means and thereby aligned.

5. A solder delivery system as in claim 1 further comprising a backing layer having a perforation aligned with each of said window means to allow an end of a conductor entering said window means to exit through said backing layer by passing through said perforation.

6. A method of aligning the stripped conductors of a cable to be soldered using the solder delivery system of claim 4 which comprises:
   (a) aligning said cable with said system;
   (b) combing the conductors; and
   (c) inserting the ends of the conductors through said window means and then through said perforation in said backing layer.

7. A solder delivery system comprising:
   (a) at least one layer of polymeric material having window means therethrough; and
   (b) a solder strip with flux disposed in operative contact with said at least one layer and adjacent said window means;
   said window means directing the flow of solder and flux from said solder strip through said window means when said delivery system is heated, and electrical conductor means permitting the formation of a soldered electrical interconnection between conductive substrates placed on either side of said at least one layer.

8. A solder delivery system as in claims 1 or 5 wherein said at least one layer having window means has adhesive character.

9. A solder delivery system as in claim 6 wherein said at least one layer is coated with an adhesive.

10. A solder delivery system as in claim 6 wherein said at least one layer is intrinsically adhesive.

11. An electrical connector cable which comprises:
    (a) at least one layer of polymeric material having at least two rows of window means therethrough;
    (b) a solder strip for each row of window means disposed in operative contact with said at least one layer and adjacent said each row of window means; and
    (c) electrical conductors disposed in operative contact with said at least one layer and running between said rows of window means.

12. A method of aligning the stripped conductors of a cable to be soldered using the solder delivery system of claim 1 which comprises:
    (a) aligning said cable with said system; and
    (b) burnishing said conductors into the window means of said system, thereby causing their alignment.

* * * * *